United States Patent
Inoue

(10) Patent No.: US 10,789,395 B2
(45) Date of Patent: Sep. 29, 2020

(54) SIMULATION DEVICE FOR CARRYING OUT SIMULATION BASED ON ROBOT PROGRAM

(71) Applicant: FANUC CORPORATION, Yamanashi (JP)

(72) Inventor: Kozo Inoue, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 815 days.

(21) Appl. No.: 14/166,581

(22) Filed: Jan. 28, 2014

(65) Prior Publication Data

US 2014/0214394 A1    Jul. 31, 2014

(30) Foreign Application Priority Data

Jan. 30, 2013    (JP) .................... 2013-015923

(51) Int. Cl.
   *G06F 30/20*    (2020.01)
   *B25J 9/16*    (2006.01)

(52) U.S. Cl.
   CPC ............ *G06F 30/20* (2020.01); *B25J 9/1671* (2013.01)

(58) Field of Classification Search
   CPC ...................................................... G06F 30/20
   See application file for complete search history.

(56) References Cited

U.S. PATENT DOCUMENTS

| 2007/0282485 A1* | 12/2007 | Nagatsuka ............ B25J 9/1671 700/245 |
| 2009/0271169 A1* | 10/2009 | Minto ...................... G09B 9/00 703/18 |
| 2013/0013283 A1* | 1/2013 | Gam .................. G06F 17/5022 703/21 |

FOREIGN PATENT DOCUMENTS

| JP | 07-036516 A | 2/1995 |
| JP | 7200019 A | 8/1995 |
| JP | 09-038876 A | 2/1997 |
| JP | 2000-081906 A | 3/2000 |

(Continued)

OTHER PUBLICATIONS

IPS, "Dynamic Training Simulator System for a Generic IGCC Plant", Invensys Process Systems, http://www.enginomix.net/wp-content/themes/thesis/documents/IPS_IGC_%20Functional_Design_Specification_Dec2008.pdf, Dec. 2008, 56 pages.*

(Continued)

*Primary Examiner* — Omar F Fernandez Rivas
*Assistant Examiner* — David A Hopkins
(74) *Attorney, Agent, or Firm* — Hauptman Ham, LLP

(57) ABSTRACT

A simulation device capable of executing a proper simulation without changing a program, while the definition of virtual peripheral equipment and/or a PLC is not necessary. A signal status setting file, which is separated from a robot program, can be executed in parallel with the program, and includes a command for setting or changing a signal status described corresponding to a line in execution of the program, wherein the status is referenced by executing the line of the program. For example, a command of the file, described corresponding to a fifth line of the robot program, commands inputting a signal which indicates that the opening motion of a door is completed. Therefore, when the simulation is executed, in synchronization with the line in execution of the program, the setting or changing of the signal status, described corresponding to the line in execution, is performed.

1 Claim, 5 Drawing Sheets

(56) References Cited

FOREIGN PATENT DOCUMENTS

| | | |
|---|---|---|
| JP | 200315706 A | 1/2003 |
| JP | 2004-148434 A | 5/2004 |
| JP | 2004148428 A | 5/2004 |
| JP | 2007102632 A | 4/2007 |
| JP | 2007293409 A | 11/2007 |

OTHER PUBLICATIONS

Pieter J. Mosterman, An Overview of Hybrid Simulation Phenomena and Their Support by Simulation Packages, Lecture Notes in Computer Science vol. 1569, 1999.

* cited by examiner

FIG. 2

| LINE NUMBER | PROGRAM | SIGNAL STATUS SETTING | SIGNAL DELAY TIME |
|---|---|---|---|
| 1 | USER FRAME=1 | | |
| 2 | TOOL FRAME=1 | | |
| 3 | POSITION OF STRAIGHT LINE [1:IN FRONT OF MACHINE (ENTER)] 2000 mm/sec POSITIONING | | |
| 4 | DO[1:DOOR-OPEN-REQUEST]=ON | | |
| 5 | WAIT DI[1:DOOR-OPEN-COMPLETE]=ON | DI[1:DOOR-OPEN-COMPLETE]=ON | 1000ms |
| 6 | POSITION OF STRAIGHT LINE [2:LOCATE UNPROCESSED WORKPIECE] 2000 mm/sec POSITIONING | | |
| 7 | RO[1:HAND-OPEN-REQUEST]=ON | | |
| 8 | WAIT RI[2:HAND-OPEN-COMPLETE]=ON | RI[2:HAND-OPEN-COMPLETE]=ON | 500ms |
| 9 | DO[2:CLAMPER-CLOSE-REQUEST]=ON | | |
| 10 | WAIT DI[2:CLAMPER-CLOSE-COMPLETE]=ON | DI[2:CLAMPER-CLOSE-COMPLETE]=ON | 500ms |
| 11 | POSITION OF STRAIGHT LINE [1:IN FRONT OF MACHINE (EXIT)] 2000 mm/sec POSITIONING | | |
| 12 | DO[2:DOOR-CLOSE-REQUEST]=ON | | |
| 13 | WAIT DI[2:DOOR-CLOSE-COMPLETE]=ON | DI[2:DOOR-CLOSE-COMPLETE]=ON | 1000ms |

FIG. 5

| ITEM | SETTING CONTENTS |
|---|---|
| DO[1:DOOR-OPEN-REQUEST] | OFF |
| DI[1:DOOR-OPEN-COMPLETE] | OFF |
| RO[1:HAND-OPEN-REQUEST] | OFF |
| RI[1:HAND-OPEN-COMPLETE] | OFF |
| DO[2:CLAMPER-CLOSE-REQUEST] | OFF |
| DI[2:CLAMPER-CLOSE-COMPLETE] | OFF |
| DO[2:DOOR-CLOSE-REQUEST] | ON |
| DI[2 DOOR-CLOSE-COMPLETE] | ON |
| ROBOT POSITION | X=＊＊＊、Y=＊＊＊... |
|  |  |

FIG. 6

| LINE NUMBER | PROGRAM |
|---|---|
| 1 | LABEL[1] |
| 2 | IF DI[1]=ON, THEN JUMP LABEL[2] |
| 3 | CALL PROG-A |
| 4 | JUMP LABEL[3] |
| 5 | LABEL[2] |
| 6 | CALL PROG-B |
| 7 | LABEL[3] |
| 8 | IF DI[3]=OFF, THEN JUMP LABEL[1] |

| | SIGNAL STATUS SETTING |
|---|---|
| | If REGI[1]=1 then<br>　DI[1]=ON<br>　DI[3]=ON<br>Else<br>　DI[1]=OFF<br>　DI[3]=OFF |
| | REGI[1]=1 |
| | REGI[1]=2 |
| | |

SIMULATION DEVICE FOR CARRYING OUT SIMULATION BASED ON ROBOT PROGRAM

RELATED APPLICATIONS

The present application claims priority to Japanese Application Number 2013-015923, filed Jan. 30, 2013, the disclosure of which is hereby incorporated by reference herein in its entirety.

BACKGROUND OF THE INVENTION

1. Field of the Invention

The preset invention relates to a simulation device for carrying out a simulation of a robot based on a robot program.

2. Description of the Related Art

In the prior art, in order to check the motion of a system or a factory including a robot and estimate a performance thereof, a technique for a simulation using a virtual robot, etc., has been proposed.

For example, Japanese Unexamined Patent Publication (Kokai) No. 2000-081906 discloses a virtual factory simulation device including a virtual controller for simulating a controller based on motion data, and a plurality of virtual instrument simulators having virtual instruments for simulating mechanical motions based on motion commands from the virtual controller.

Japanese Unexamined Patent Publication (Kokai) No. 2000-081906 discloses a pseudo controller for controlling the motion of a virtual robot, a sequencer capable of controlling the pseudo controller, a main communication means connecting the pseudo controller and the sequencer, and a pseudo console panel for transmitting or receiving a signal to or from the sequencer, wherein the sequencer and the pseudo controller are configured to check the motion of the virtual robot via the main communication means.

Japanese Unexamined Patent Publication (Kokai) No. H07-036516 describes that a robot controller and a control unit are modeled as virtual control means; a control program of the virtual control means is input as a sequence control language by means of a virtual control program inputting means; and a control motion simulation means simulates the control motion of the virtual control means based on the sequence control language.

Japanese Unexamined Patent Publication (Kokai) No. H09-038876 discloses a simulation device having a status transition storing part for storing a status transition diagram on which a control procedure in relation to an I/O status of a robot and peripheral equipment is described, wherein the simulation device performs a simulation using a model of the robot and peripheral equipment based on the status transition diagram.

In many cases, a robot program used in an actual robot includes a signal control command for interlocking with peripheral equipment and a branch/wait command depending on a signal condition. Therefore, when such a program is executed in a simulator, desired motions cannot be performed since a feedback signal is not transmitted from the peripheral equipment.

Further, as a method for checking a robot program, a method wherein virtual peripheral equipment is located in a simulation device so as to input pseudo signal into the peripheral equipment; a method wherein an operator inputs a signal by means of a pseudo switch; or a method wherein a PLC (programmable logic controller) is used to input/output a signal, may be possible. However, in these methods, it is necessary to define corresponding virtual unit and virtual console, and connect the virtual unit and console to an actual PLC, whereby a preparation of the simulation becomes troublesome. Further, in the method using the pseudo switch, the manual operation is necessary.

On the other hand, a method, wherein a program for an actual unit is changed so as to delete or comment out an unnecessary part of the program, may also be possible. In this case, however, since the program itself is changed, a precise simulation may not be performed.

In addition, in order to simulate an operation time of peripheral equipment, it is necessary to prepare virtual peripheral equipment and PLC, use a timer thereof, and write a command for setting a waiting time into a program, while these operations require man-hours. Further, since the status of the signal is changed after the simulation is once executed, the same result cannot be obtained even if the same simulation is repeated.

SUMMARY OF THE INVENTION

Therefore, an object of the present invention is to provide a simulation device capable of executing a proper simulation without changing a program, while the definition of virtual peripheral equipment and/or a PLC is not necessary.

According to the present invention, a simulation device for performing a simulation of a robot based on a robot program, wherein the simulation device further uses a separate file which is different from the robot program, wherein the separate program includes a command for setting a status of a signal or a command for setting a value of a data register, the command being described corresponding to a line of the robot program, the status and the value being referenced by executing the line of the robot program, and wherein the status of the signal or the value of the data register described corresponding to the line in execution of the robot program is changed in synchronization with the line in execution of the robot program, when the simulation is performed based on the command.

In a preferred embodiment, the command for setting a status of a signal specifies at least a name of the signal and a signal state to be set, and the command for setting a value of a data register specifies at least a name of the data register and a value to be set.

In a preferred embodiment, the robot program includes a logic command which references the status of the signal and/or the value of the data register, and a line of the robot program corresponding to the logic command is automatically specified displayed.

In a preferred embodiment, the command includes a specification of a delay time, and the status of the signal or the value of the data register is set to a status or a value to be set after the delay time has passed from when the corresponding line of the program is executed.

In a preferred embodiment, the status of the signal, the value of the data register, or a position of the robot is specified at the beginning of the simulation, such that an initial setting of the status of the signal, the value of the data register, or the position of the robot is changed.

In a preferred embodiment, the status of the signal or the value of the data register in a specified line of the program is changed to a specified status or value.

BRIEF DESCRIPTION OF THE DRAWINGS

The above and other objects, features and advantages of the present invention will be made more apparent by the following description of the preferred embodiments thereof, with reference to the accompanying drawings, wherein:

FIG. 2 shows an example of a robot program executed by the simulation device;

FIG. 5 shows an initial setting of a status of a signal at the beginning of the program; and FIG. 6 shows an example of a robot program wherein a procedure can be changed by an external signal.

DETAILED DESCRIPTIONS

Figure 1:
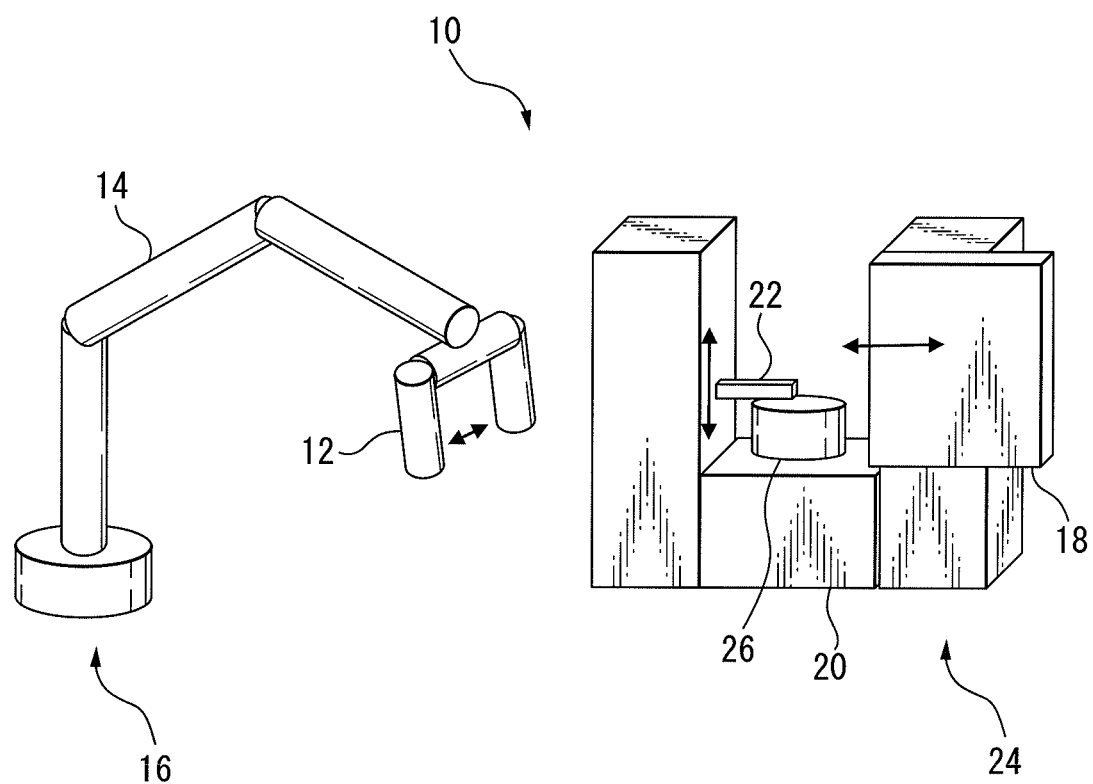
FIG. 1 shows an example of a configuration of a robot system, which can be simulated by a simulation device according to an embodiment of the invention.

FIG. 1 shows an example of a configuration of a system, which can be simulated by a simulation device according to an embodiment of the invention. System 10 includes a robot 16 having a robot arm 14 with a movable hand 12 attached to a front end of arm 14; and a machine (or machine tool) 24 having an openable and closable door 18, a working table 20 and an openable and closable clamper 22, wherein hand 12, door 18 and clamper 22 are controlled by I/O signals from robot 16. Hand 12 is configured to grip a workpiece 26 and convey workpiece 26 onto working table 20 of machine tool 24. Clamper 22 is configured to hold workpiece 26 on working table 20 so that machine 24 may carry out a predetermined processing of workpiece 26. The simulation device of the embodiment is configured to simulates a series of operations, i.e., robot 16 approaches machine 24 while gripping workpiece 26 by means of hand 12; door 18 opens upon when hand 12 reaches a predetermined position; hand 12 enters machine 24 and puts workpiece 26 onto working table 20; and clamper 22 closes so as to hold workpiece 26.

FIG. 2 shows an example of a robot program 30 executed by the simulation device for simulating the above operations. First, in first and second lines of the program, a user frame and a tool frame are specified, respectively. Next, in a third line, hand 12 gripping workpiece 26 is moved at a predetermined velocity, and is positioned at a predetermined place (for example, in front of door 18 of machine 24).

Next, in a fourth line, a signal for requesting door 18 of machine 24 to open (a name of the signal is "door-open-request") is output, and then, in a fifth line, the procedure waits until a signal, indicating that door 18 is fully opened (a name of the signal is "door-open-complete"), is input. In this regard, in the present invention, a signal status setting file 32, which is separated from robot program 30, is used. File 32 can be executed in parallel with program 30, and includes a command for setting or changing a status of the signal (or a signal status) described corresponding to a line in execution of robot program 30, wherein the status is referenced by executing the line of the robot program. In the example of FIG. 2, a command 34 of file 32, which is described corresponding to a fifth line of the robot program, commands inputting a signal (1: door-open-complete) which indicates that the opening motion of door 18 is completed. By virtue of this, when the simulation is executed, in synchronization with the line in execution (the fifth line in this case) of robot program 30, the setting or changing of the signal status, described corresponding to the line in execution, is performed.

Next, in a sixth line, hand 12 gripping workpiece 26 is moved (forward) at a predetermined velocity through opened door 18, and workpiece 26 is positioned at a predetermined place (for example, on working table 20).

Next, in a seventh line, a signal for requesting hand 12 to open (a name of the signal is "hand-open-request") is output, and then, in an eighth line, the procedure waits until a signal, indicating that hand 12 is fully opened (a name of the signal is "hand-open-complete"), is input. In this regard, similarly to the fifth line, signal status setting file 32, which is separated from robot program 30, includes a command 36, which is described corresponding to the eighth line of robot program 30. Command 36 commands inputting a signal (1: hand-open-complete) which indicates that the opening motion of hand 12 is completed. By virtue of this, in synchronization with the eighth line of robot program 30, the setting or changing of the signal status, described corresponding to the line in execution, is performed.

Next, in a ninth line, a signal for requesting clamper 22 of machine 24 to close (a name of the signal is "clamper-close-request") is output, and then, in a tenth line, the procedure waits until a signal, indicating that clamper 22 is fully closed (a name of the signal is "clamper-close-complete"), is input. In this regard, similarly to the fifth and eighth lines, signal status setting file 32, which is separated from robot program 30, includes a command 38, which is described corresponding to the tenth line of robot program 30. Command 38 commands inputting a signal (2: clamper-close-complete) which indicates that the closing motion of clamper 22 is completed. By virtue of this, in synchronization with the tenth line of robot program 30, the setting or changing of the signal status, described corresponding to the line in execution, is performed.

Then, in an eleventh line, hand 12 is moved (backward) at a predetermined velocity through opened door 18, and is positioned at a predetermined place (for example, in front of door 18 of machine 24).

Next, in a twelfth line, a signal for requesting door 18 of machine 24 to close (a name of the signal is "door-close-request") is output, and then, in a thirteenth line, the procedure waits until a signal, indicating that door 18 is fully closed (a name of the signal is "door-close-complete"), is input. In this regard, similarly to the fifth, eighth and tenth lines, signal status setting file 32, which is separated from robot program 30, includes a command 40, which is described corresponding to the thirteenth line of robot program 30. Command 40 commands inputting a signal (2: door-close-complete) which indicates that the closing motion of door 18 is completed. By virtue of this, in synchronization with the thirteenth line of robot program 30, the setting or changing of the signal status, described corresponding to the line in execution, is performed. In commands 34, 36, 38 and 40, at least the name of the signal and the signal status to be set can be specified.

Figure 3:
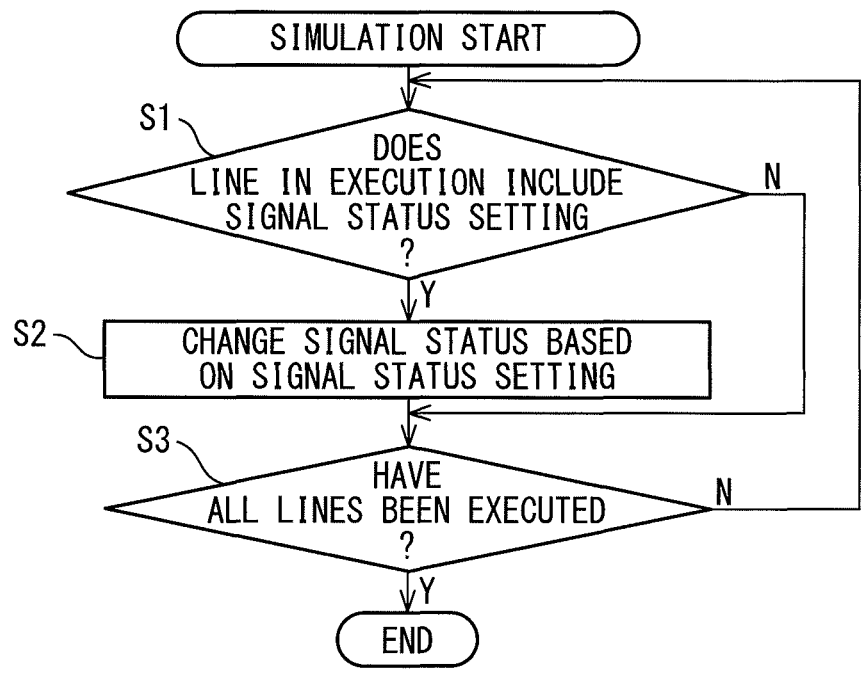
FIG. 3 is a flowchart showing an example of a procedure of the simulation device.

FIG. 3 is a flowchart showing a procedure when the simulation device carries out a simulation. When the simulation is started, the lines of the robot program are sequentially executed. In this regard, in step S1, it is judged as to whether the line in execution includes a command for setting the signal status or not. If the line includes such a command (corresponding to the fifth, eighth, tenth and thirteenth lines in the example of FIG. 2), the procedure progresses to step S2, wherein the signal status is set or updated based on the corresponding command for setting or changing the signal status included in the file separated from the robot program. By repeating such procedures to the last line of the robot program (step S3), the predetermined simulation is completed.

Arbitrarily, as shown in a table 42 of FIG. 2, before setting the signal status by means of file 32, the signal status may not be set until a predetermined setting time has been passed after the corresponding line in program 30 is executed (in other words, a signal delay time may be set). In the illustrated example, the setting of the signal status (or command 34) in synchronization with the fifth line of program 30 is not executed until 1000 milliseconds has been passed after the start of execution of the fifth line. Similarly, with respect to the eighth, tenth and thirteenth lines of program 30, an appropriate delay time may be set. By virtue of the setting of the delay time as described above, a delay time of a feedback signal of an actual machine may be set, whereby a more realistic simulation can be performed. In addition, the setting of the delay time may be similarly applied to a case wherein a value of a data register is set or changed, as described below.

Figure 4:
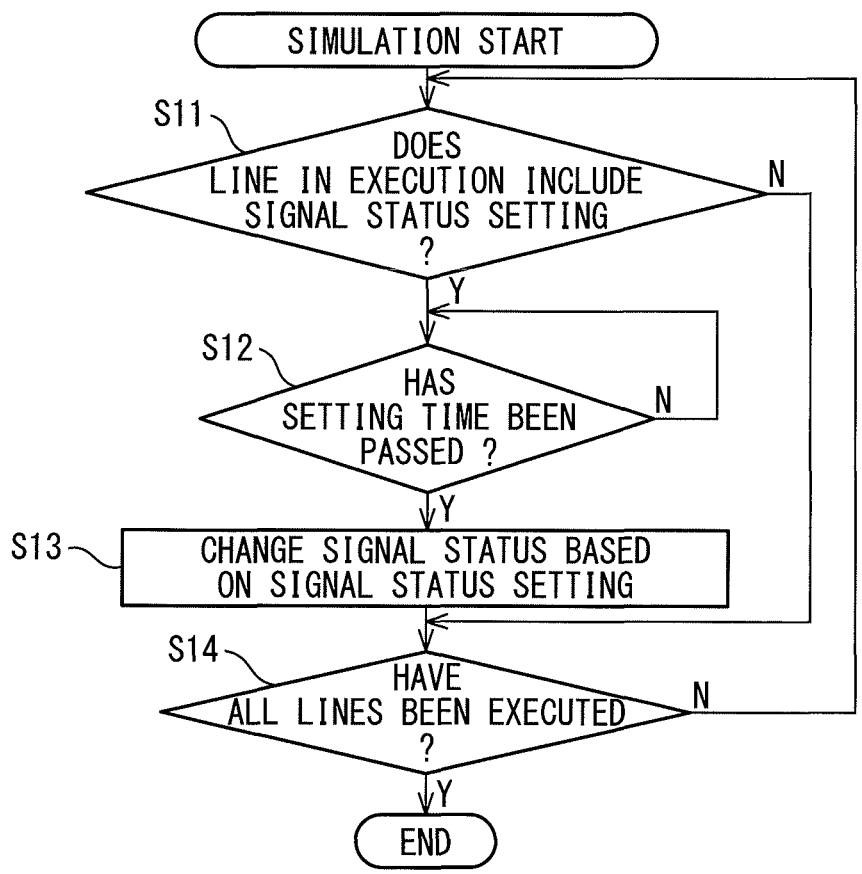
FIG. 4 is a flowchart showing an example of another procedure of the simulation device.

FIG. 4 is a flowchart showing a procedure when the simulation device carries out a simulation, in which the above signal delay time is set. When the simulation is started, the lines of the robot program are sequentially executed. In this regard, in step S11, it is judged as to whether the line in execution includes a command for setting the signal status or not. If the line includes such a command (corresponding to the fifth, eighth, tenth and thirteenth lines in the example of FIG. 2), the procedure progresses to step S12, wherein the procedure is suspended until a predetermined setting time (or delay time) has been passed. After that, in step S13, the signal status is set or updated based on the corresponding command for setting or changing the signal status included in the file separated from the robot program. By repeating such procedures to the last line of the robot program (step S14), the predetermined simulation is completed.

A table 44 as shown in FIG. 5 illustrates an example of initial setting of a status of each signal and a robot position at the beginning of the simulation. In this example, at the beginning of the simulation, outputting of a signal regarding open-request for door 18 and inputting of a signal regarding close-request for door 18 are set to "ON," and the other signals are set to "OFF." Such initial setting may be performed by the file separated from robot program 30. Usually, since the signal status is changed from the initial status at the end of simulation, the same result may not be obtained even when the same simulation is repeated. However, by performing the initial setting as described above, the signal status at the beginning of the simulation can be always constant, further, the robot can be moved to a position which is specified at the beginning of the simulation. Therefore, repeatability of the program may be improved. Although not shown in FIG. 5, in relation to a value of a data register as described below, an initial value may be predetermined, and the value of the data register may be set to the initial value at the beginning of the simulation.

FIG. 6 shows a simulation device for setting or changing a value of a data register (or a register value) in synchronization with execution of a robot program. A robot program 46 exemplified in FIG. 6 selects and executes either a sub-program "A" or "B" depending on the register value. Concretely, if the register value is "1" in a second line, then program A is executed. Otherwise, if the register value is not "1," then program B is executed instead of program A. Such procedure is repeated.

In this regard, the present invention uses a data register setting file 48, which is separated from robot program 46. File 48 can be executed in parallel with program 46 and includes a command for setting or changing a status of the signal (or a signal status) described corresponding to a line in execution of robot program 46, wherein the status is referenced by executing the line of the robot program. In the example of FIG. 6, a command 50 of file 48, which is described corresponding to a third line of the robot program for calling program A, sets a value "1" to the data register (a name of the register is "regi [1]"), in synchronization with the third line. On the other hand, a command 52 of file 48, which is described corresponding to a sixth line of the robot program for calling program B, sets a value other than "1" (in this case, "2") to the data register (a name of the register is "regi [1]"), in synchronization with the sixth line. In addition, command 54 of file 48, which is described corresponding to a first line of the robot program, is a command for setting different signal statuses depending on the value of "regi [1]," i.e., for changing the signal status based on the condition of the register. Therefore, when the simulation is performed based on robot program 46, programs A and B are alternately repeated. In commands 50 and 52, at least the name of the data register and the value to be set can be specified.

In the embodiment of FIG. 6, in the specified line (in this case, the third and sixth lines) of robot program 46, the value of the register is changed and the different programs are performed based on the value. Therefore, this embodiment is suitable for a sequence control simulation wherein a robot is operated by an external signal such as a signal from an external controller, etc. Although not shown, when a simulation wherein a plurality of same kind of workpieces are sequentially processed is to be carried out, the data register setting file may include a command for setting or changing a value of a counter as the data register, the counter indicating the number of times of the processing of the workpiece.

As explained with respect to the above embodiments, when the robot program includes a logic command for referring the signal status or the data register value, a line corresponding to the logic command may be automatically specified from the robot program and displayed. By virtue of this, the program can be checked without using virtual peripheral equipment or a PLC. Further, since the logic command is automatically associated with the line, the signal status can be easily set.

According to the present invention, the signal status or the data register value is set corresponding to the line of the robot program, and the signal status or the data register value is changed in synchronization with the line in execution of the robot program. Therefore, the program can be easily checked without using virtual peripheral equipment or PLC, and it is not necessary to modify the program.

By automatically specifying and displaying the line corresponding to the logic command for referring the signal status or the data register value, a signal command or a data register command can be automatically detected from the robot program, and the line can be automatically associated with the signal or the data register.

When peripheral equipment is to be operated by means of an output signal of the robot, by setting the delay time, a period of time from outputting of the output signal to receiving of an operation complete signal from the peripheral equipment can be set as a delay time, whereby a more realistic simulation can be performed.

By setting the initial state of the signal, etc., the signal status at the beginning of the simulation can be set to a desired status.

By changing the signal status or the data register value in a specified line to a designated signal status or data register value, a simulation can be performed, in which the procedure is bifurcated by means of a signal from external controller (or an external signal).

While the invention has been described with reference to specific embodiments chosen for the purpose of illustration, it should be apparent that numerous modifications could be made thereto, by one skilled in the art, without departing from the basic concept and scope of the invention.

The invention claimed is:

1. A simulation device comprising a processor configured to perform a simulation of a robot based on a robot program,
   wherein the processor of the simulation device is further configured to use a separate file which is different from the robot program,
   wherein the separate file includes a plurality of lines each corresponding to one line of the robot program,
   wherein the separate file includes, in a line among the plurality of lines of the separate file, a command for setting a status of a signal or a command for setting a value of a data register, the command being described corresponding to a line of the robot program, the status and the value being referenced and provided from the separate file to the robot program by executing the line of the robot program,
   wherein the status of the signal or the value of the data register described corresponding to the line in execution of the robot program is changed based on the command in synchronization with the line in execution of the robot program, when the simulation is performed, and
   wherein
   the separate file represents feedback signals from peripheral equipment other than the robot being controlled by the robot program, and
   the peripheral equipment is configured
      to perform operations in response to output signals from the robot, and
      to provide the feedback signals to the robot upon completion of the operations.

* * * * *